(12) United States Patent
Yoshihara et al.

(10) Patent No.: US 6,362,037 B1
(45) Date of Patent: Mar. 26, 2002

(54) SEMICONDUCTOR DEVICE AND METHOD OF FABRICATING SAME

(75) Inventors: Ikuo Yoshihara; Kazuaki Kurooka, both of Nagasaki (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/131,350

(22) Filed: Aug. 10, 1998

Related U.S. Application Data

(62) Division of application No. 08/964,907, filed on Nov. 5, 1997, now Pat. No. 6,124,617.

(30) Foreign Application Priority Data

Nov. 5, 1996 (JP) .......................................... P08-308779
Dec. 27, 1996 (JP) .......................................... P08-358921

(51) Int. Cl.$^7$ ......................................... H01L 21/8238
(52) U.S. Cl. ........................ 438/210; 438/202; 438/222
(58) Field of Search ................................ 438/202, 200, 438/199, 197, 203, 210, 222, 207, 208, 329

(56) References Cited

U.S. PATENT DOCUMENTS

| | | | | |
|---|---|---|---|---|
| 4,089,021 A | * | 5/1978 | Sato et al. | 357/20 |
| 4,292,642 A | * | 9/1981 | Appels et al. | 357/13 |
| 4,589,004 A | * | 5/1986 | Yasuda et al. | 357/23.4 |
| 4,984,200 A | * | 1/1991 | Saitoo et al. | 365/154 |
| 4,988,633 A | * | 1/1991 | Josquin | 438/207 |
| 5,100,815 A | * | 3/1992 | Tsubone et al. | 437/34 |
| 5,148,255 A | * | 9/1992 | Nakazato et al. | 357/43 |
| 5,457,062 A | * | 10/1995 | Keller et al. | 438/202 |
| 5,480,815 A | * | 1/1996 | Watanabe | 438/365 |
| 5,643,806 A | * | 7/1997 | Miwa et al. | 438/366 |
| 5,698,893 A | * | 12/1997 | Perera et al. | 257/627 |
| 5,828,112 A | * | 10/1998 | Yamaguchi | 257/378 |

* cited by examiner

Primary Examiner—Carl Whitehead, Jr.
Assistant Examiner—Jeff Vockrodt
(74) Attorney, Agent, or Firm—Sonnenschein, Nath & Rosenthal

(57) ABSTRACT

An N-type buried diffusion layer as a portion of the collector region of a bipolar transistor and an N-type buried diffusion layer of a memory cell region are simultaneously formed, and the buried diffusion layer of the memory cell region serves as a potential groove for electrons. The threshold voltage of a MOS transistor in the memory cell region is higher than the threshold voltage of a MOS transistor in a peripheral circuit region, preventing an increase in the standby current in the memory cell region. This increases the soft error resistance of the memory cell and prevents a decrease in the operating speed and an increase in the consumption power.

8 Claims, 17 Drawing Sheets

SEMICONDUCTOR DEVICE AND METHOD OF FABRICATING SAME

This application is a divisional of application Ser. No. 08/964,907 filed Nov. 5, 1997 now U.S. Pat. No. 6,124,617.

BACKGROUND OF THE INVENTION

1. Field of the Invention

The present invention relates to a semiconductor device having a memory cell region in which at least a field-effect transistor is formed and a non-memory cell region in which at least a bipolar transistor is formed, and a method of fabricating the same.

2. Description of the Related Art

An SRAM has a memory cell region and a peripheral circuit region. FIG. 18 shows an equivalent circuit of a memory cell of a high-resistance load type SRAM. A flip-flop 11 of this memory cell includes NMOS transistors 12 and 13 for driving and resistive elements 14 and 15 as loads. The memory cell is constituted by this flip-flop 11 and transfer NMOS transistors 16 and 17.

A ground line 21 is connected to the source regions of the NMOS transistors 12 and 13, and a power line 22 is connected to the resistive elements 14 and 15. Also, a word line 23 serves as a gate electrode of the NMOS transistors 16 and 17. A pair of non-inverted and inverted bit lines 24 and 25 are each connected to one of the source/drain regions of the NMOS transistors 16 and 17, respectively.

In an SRAM with this arrangement, the drain regions of the NMOS transistors 12 and 13 serve as storage node diffusion layers. Electric charge is stored in these drain regions, and data is stored by setting these drain regions at a predetermined potential. However, if α rays emitted from a slight amount of a radioactive element such as uranium or thorium contained in a packaging mold resin or the like enter a semiconductor base, electron-hole pairs are generated by impact ionization by the α rays.

Holes of the generated electron-hole pairs flow in a grounded P-well in the semiconductor base. Electrons are trapped in the drain regions of the NMOS transistors 12 and 13 and the like to which a positive voltage is applied. As a consequence, the amount of electric charge stored in these drain regions varies, and this can cause a soft error in which the potential of these drain regions is inverted to invert the stored data.

Especially when α rays penetrate through the drain regions and their depletion layers of the NMOS transistors 12 and 13, these depletion layers instantaneously extend to bring about a funneling phenomenon. Consequently, the electron trap efficiency increases, and this can further increase the possibility of a soft error.

It is, therefore, being attempted to add a capacitor between the storage nodes to trap electrons generated by the impact ionization into this capacitor (e.g., Japanese Patent Laid-Open No. 62-154296), or to form a P$^+$-type buried diffusion layer, as a potential barrier against electrons, in a memory cell region to thereby prevent diffused electrons from moving into the depletion layers (e.g., Japanese Patent Laid-Open No. 62-245660).

A bipolar transistor is formed in a peripheral circuit region or the like of an SRAM. As is well known, when the base and emitter regions of a bipolar transistor are formed by rapid thermal annealing such as halogen lamp annealing, the base width which is the difference between the depths of the base and emitter regions can be accurately controlled, and consequently the characteristics of the bipolar transistor, particularly the high-frequency characteristics such as the cut-off frequency can be improved.

The structure in which a capacitor is additionally formed as described in Japanese Patent Laid-Open No. 62-154296 is effective to a semiconductor device, such as a TFT load type SRAM, using two conductive layers as load elements. However, it is difficult to apply this structure to a semiconductor device, such as a high-resistance load type SRAM, using only one conductive layer as a load element, since a capacitor is difficult to form.

In the case of the structure in which a P$^+$-type buried diffusion layer is formed in a memory cell region as described in Japanese Patent Laid-Open No. 62-245660, it is necessary to add fabrication steps of additionally forming this P$^+$-type buried diffusion layer. Therefore, it is difficult to increase the soft error resistance while suppressing an increase in the fabrication cost.

In addition, when the P$^+$-type buried diffusion layer is formed by high-energy ion implantation, defective layers may locally remain in a semiconductor base due to ion implantation damage even if annealing for recovering the crystallinity is performed after the ion implantation. Accordingly, it is difficult to increase the soft error resistance without lowering the storage retention ability on a one-bit level.

Furthermore, when the base and emitter regions are formed by rapid thermal annealing in order to improve the characteristics of a bipolar transistor in a peripheral circuit region of an SRAM or the like, an impurity in load elements such as the resistive elements 14 and 15 diffuses, and the characteristics of the load elements vary. Also, a gate insulating film deteriorates, and hot carriers are injected into the gate insulating film. Consequently, the characteristics such as the gate withstand voltage and the life of a MOS transistor in a memory cell region or the like easily deteriorate.

As described above, a large number of conventional methods have been reported which apply rapid thermal annealing to a simple device including only a bipolar transistor to improve its characteristics. However, it is conventionally difficult, by applying rapid thermal annealing to a composite device such as an SRAM having a bipolar transistor in a peripheral circuit region, to fabricate a semiconductor device in which elements such as a load element and a MOS transistor, other than the bipolar transistor, also have excellent characteristics.

SUMMARY OF THE INVENTION

A semiconductor device according to the present invention is a semiconductor device in which a memory cell region having a first N-type field-effect transistor and a non-memory cell region having an NPN bipolar transistor and a second N-type field-effect transistor are formed in the same semiconductor base, comprising: a first N-type buried diffusion layer formed in the semiconductor base of the memory cell region; and a second N-type buried diffusion layer forming a portion of a collector region of the bipolar transistor; wherein a threshold voltage of the first field-effect transistor is higher than a threshold voltage of the second field-effect transistor.

In the semiconductor device according to the present invention, the first buried diffusion layer preferably extends by 0.5 to 2 μm from the memory cell region into the non-memory cell region.

In the semiconductor device according to the present invention, first and second plug regions exposed to a surface of the semiconductor base are preferably connected to the first and second buried diffusion layers, respectively.

In the semiconductor device according to the present invention, it is preferable that the semiconductor base be composed of a semiconductor substrate and a 0.5- to 1-μm thick semiconductor layer formed on the semiconductor substrate, and the first and second buried diffusion layers be formed in a surface portion of the semiconductor substrate.

A first semiconductor device fabrication method according to the present invention is a method of fabricating a semiconductor device in which a memory cell region having a first N-type field-effect transistor and a non-memory cell region having an NPN bipolar transistor and a second N-type field-effect transistor are formed in the same semiconductor base, comprising the steps of simultaneously forming first and second N-type diffusion layers in surface portions of a semiconductor substrate of the memory cell region and a region in which the bipolar transistor is to be formed, respectively, growing an epitaxial layer on the semiconductor substrate to form the semiconductor base and convert the diffusion layers into buried diffusion layers, and making a threshold voltage of the first field-effect transistor higher than a threshold voltage of the second field-effect transistor.

The first semiconductor device fabrication method according to the present invention preferably further comprises the steps of simultaneously doping a P-type impurity into channel regions of the first and second field-effect transistors, and doping a P-type impurity only into the channel region of the first field-effect transistor.

A second semiconductor device fabrication method according to the present invention is a method of fabricating a semiconductor device having a memory cell region in which a flip-flop including a field-effect transistor and a load element is formed and a non-memory cell region in which a bipolar transistor is formed, comprising the steps of forming at least a base region and an emitter region of the bipolar transistor by rapid thermal annealing, and forming the load element after the rapid thermal annealing.

The second semiconductor device fabrication method according to the present invention preferably further comprises the steps of forming the load element connected to a storage node diffusion layer of the flip-flop, and doping phosphorus into the connecting portion.

In the second semiconductor device fabrication method according to the present invention, a resistive element can be used as the load element.

In the second semiconductor device fabrication method according to the present invention, a field-effect transistor having a conductivity type opposite to a conductivity type of the field-effect transistor can be used as the load element, and a gate electrode of the field-effect transistor having the opposite conductivity type can be connected to the storage node diffusion layer.

In the second semiconductor device fabrication method according to the present invention, a temperature of the rapid thermal annealing is preferably at 1000 to 1150° C.

In the semiconductor device according to the present invention, the first N-type buried diffusion layer is formed in the memory cell region. As long as a positive voltage is applied to this first buried diffusion layer, therefore, even if a rays which generate electron-hole pairs by impact ionization enter the semiconductor base, holes flow through the semiconductor base, and electrons trapped in the first buried diffusion layer flow through this first buried diffusion layer. Accordingly, it is possible to suppress variations in the amount of electric charge in the diffusion layer of the first field-effect transistor in the memory cell region.

In addition, the threshold voltage of the first field-effect transistor in the memory cell region is higher than the threshold voltage of the second field-effect transistor in the non-memory cell region. Therefore, it is possible to prevent an increase in the sub-threshold current in the first field-effect transistor resulting from upward diffusion of the impurity from the first buried diffusion layer in the memory cell region.

Generally, if the sub-threshold current in a field-effect transistor constituting a memory cell increases, it is necessary to decrease the resistance of a load element constituting the memory cell in order to ensure stable storage operation. As a consequence, the standby current in the memory cell region determined by this resistance increases. Since, however, an increase in the sub-threshold current in the first field-effect transistor in the memory cell region is prevented as described above, an increase in the standby current in the memory cell region is also prevented.

Furthermore, both the first buried diffusion layer in the memory cell region and the second buried diffusion layer which forms a portion of the collector region of the bipolar transistor in the non-memory cell region are of N type. Accordingly, the first buried diffusion layer in the memory cell region and the second buried diffusion layer in the non-memory cell region can be simultaneously formed.

Also, when the first buried diffusion layer extends by 0.5 to 2 μm from the memory cell region into the non-memory cell region, it is possible to suppress an increase in the necessary area while suppressing variations in the charge amount in the diffusion layer of the first field-effect transistor even in a peripheral portion of the memory cell region.

When the first plug region exposed to the surface of the semiconductor base is connected to the first buried diffusion layer in the memory cell region, a positive voltage can be easily applied to this first buried diffusion layer. Additionally, since the second plug region is connected to the second buried diffusion layer in the non-memory cell region, the first plug region can be formed simultaneously with the second plug region.

The smaller the thickness of the semiconductor layer on the first and second buried diffusion layers, the lower the soft error occurrence rate in the memory cell. Conversely, the larger the thickness of this semiconductor layer, the larger the open-base, grounded-emitter maximum collector voltage and the collector current in the bipolar transistor. When the thickness of this semiconductor layer is 0.5 to 1 μm, the soft error occurrence rate is low, and the open-base, grounded-emitter maximum collector voltage and the collector current are large.

In the first semiconductor device fabrication method according to the present invention, after first and second diffusion layers are formed in a surface portion of a semiconductor substrate, an epitaxial layer is grown on this semiconductor substrate to form first and second buried diffusion layers in a semiconductor base. That is, the first and second buried diffusion layers are not formed by high-energy ion implantation. Accordingly, no defective layers locally remain in the semiconductor base due to ion implantation damage.

In addition, the first buried diffusion layer in a memory cell region and the second buried diffusion layer which forms a portion of the collector region of a bipolar transistor in a non-memory cell region are simultaneously formed. Therefore, the number of fabrication steps is not increased by the formation of the first buried diffusion layer in the memory cell region.

A P-type impurity is simultaneously doped into the channel regions of both first and second field-effect transistors, and a P-type impurity is doped only into the channel region of the first field-effect transistor, thereby making the threshold voltage of the first field-effect transistor higher than the threshold voltage of the second field-effect transistor. This decreases the number of masks compared to a case where a P-type impurity is separately doped into channel regions of first and second field-effect transistors.

In the second semiconductor device fabrication method according to the present invention, at least the base and emitter regions of a bipolar transistor are formed by rapid thermal annealing. Therefore, the base width of the bipolar transistor can be accurately controlled. Additionally, since a load element is formed after the rapid thermal annealing, diffusion of an impurity in the load element can be prevented.

Also, phosphorus is doped into a connecting portion between a storage node diffusion layer and a load element of a flip-flop. Since phosphorus has a larger diffusion coefficient than that of, e.g., arsenic, even if the load element is formed after the rapid thermal annealing, phosphorus can be well diffused by annealing after the formation of the load element. Consequently, it is possible to decrease a change in the impurity concentration in the storage node diffusion layer and reduce the junction leakage in this storage node diffusion layer.

When the temperature of the rapid thermal annealing for forming at least the base and emitter regions of the bipolar transistor is set at 1000 to 1150° C., the base width of the bipolar transistor can be accurately controlled. Additionally, it is possible to prevent deterioration of a gate insulating film of the field-effect transistor and injection of hot carriers into the gate insulating film.

DETAILED DESCRIPTION OF THE PREFERRED EMBODIMENT

Figure 1:
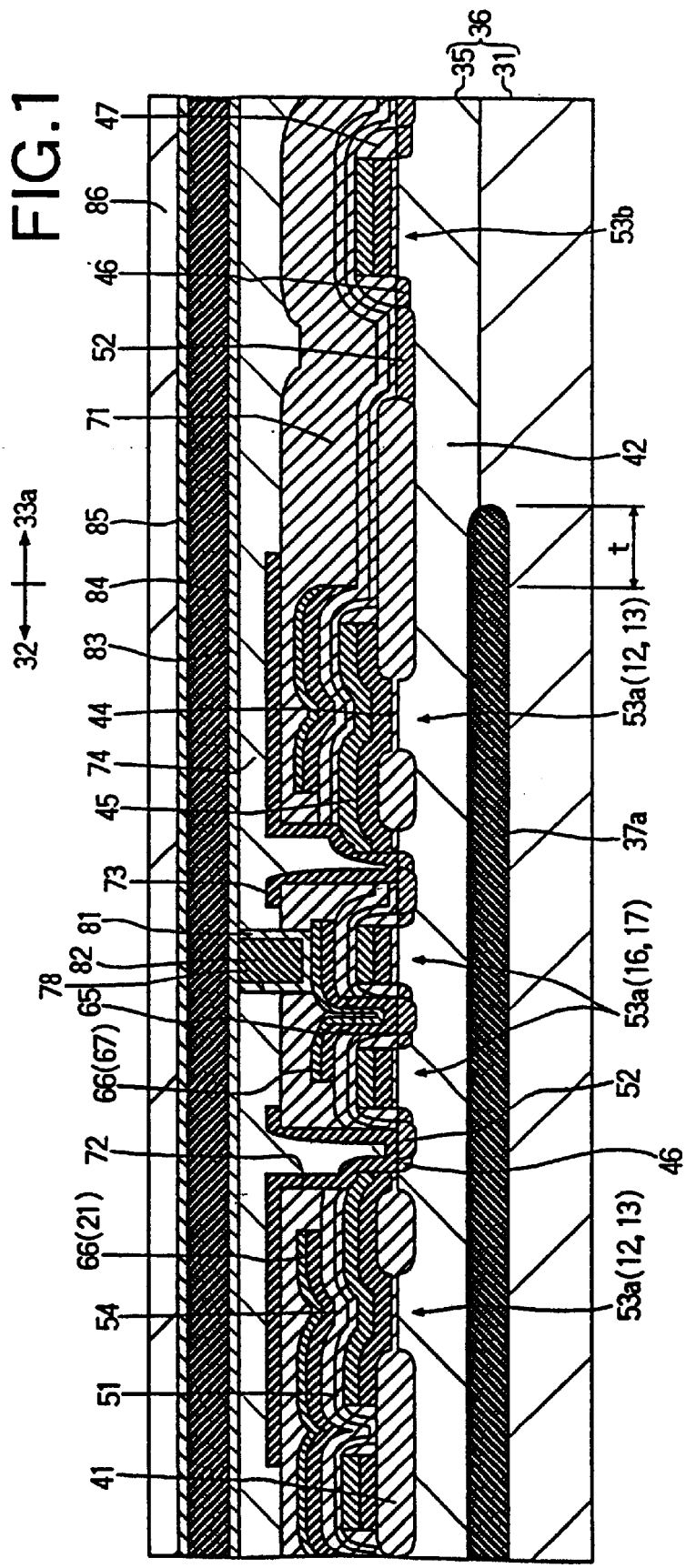
FIG. 1 is a side sectional view showing a memory cell region and its adjacent peripheral circuit region of a high-resistance load type SRAM according to an embodiment of the present invention.
Figure 2:
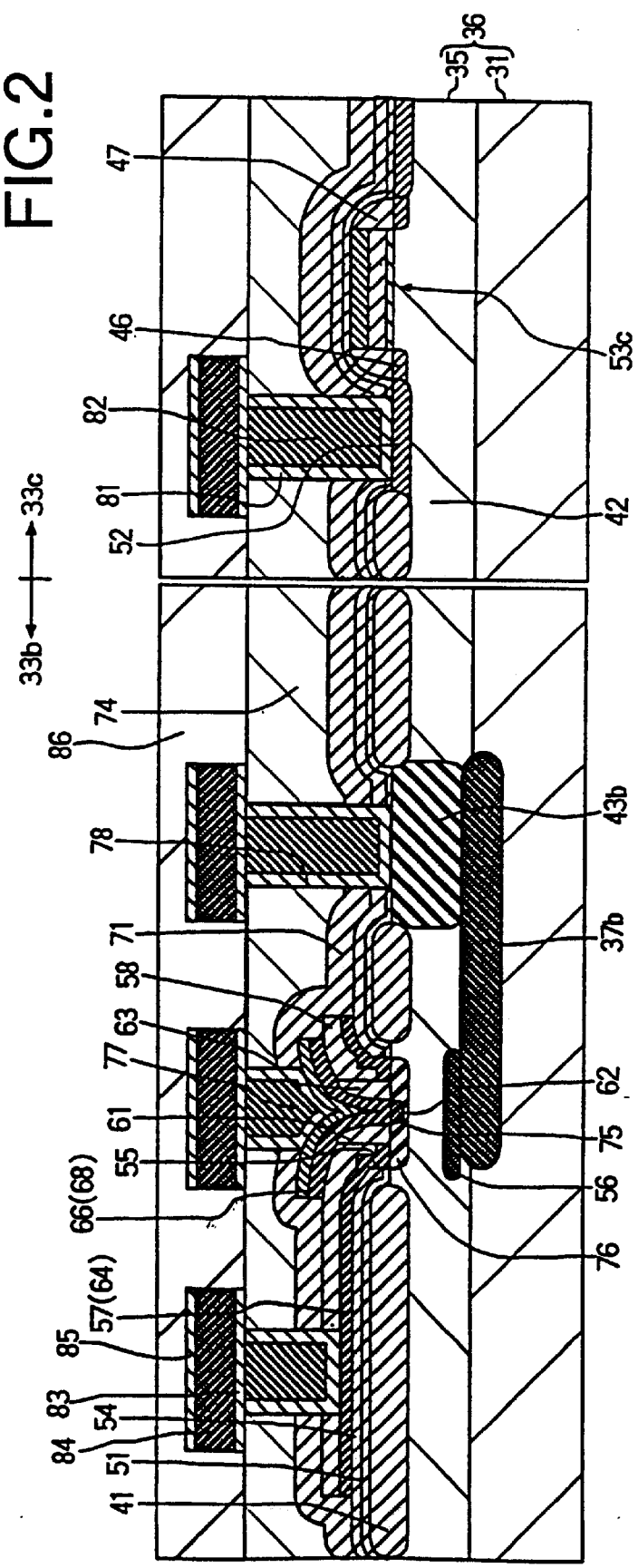
FIG. 2 is a side sectional view of peripheral circuit regions of the high-resistance load type SRAM according to the embodiment.
Figure 3:
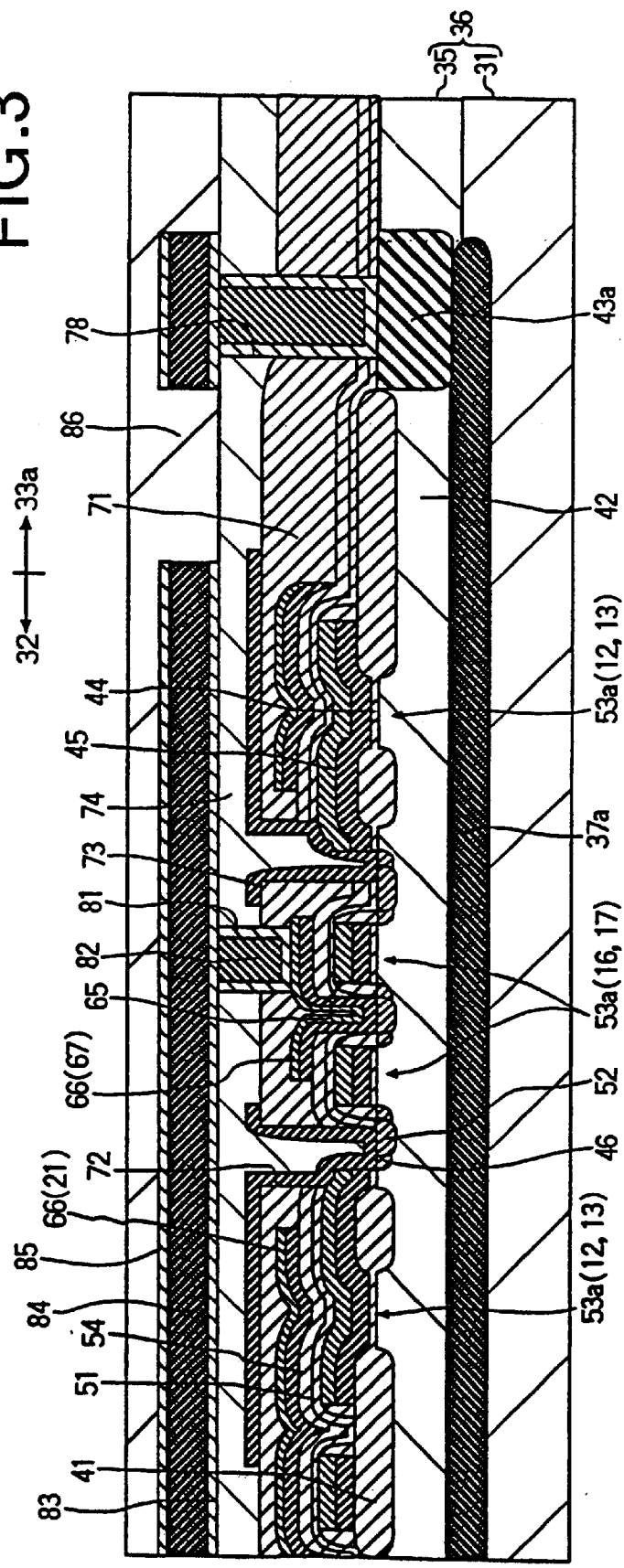
FIG. 3 is a side sectional view of a portion different from the portion shown in FIG. 1 of the memory cell region of the high-resistance load type SRAM according to the embodiment.

FIG. 1 is a side sectional view of a memory cell region and its adjacent peripheral circuit region of a high-resistance load type SRAM according to an embodiment of the present invention. FIG. 2 is a side sectional view of peripheral circuit regions of the high-resistance load type SRAM according to the embodiment. FIG. 3 is a side sectional view of a portion different from the portion shown in FIG. 1 of the memory cell region of the high-resistance load type SRAM according to the embodiment.

Figure 4:
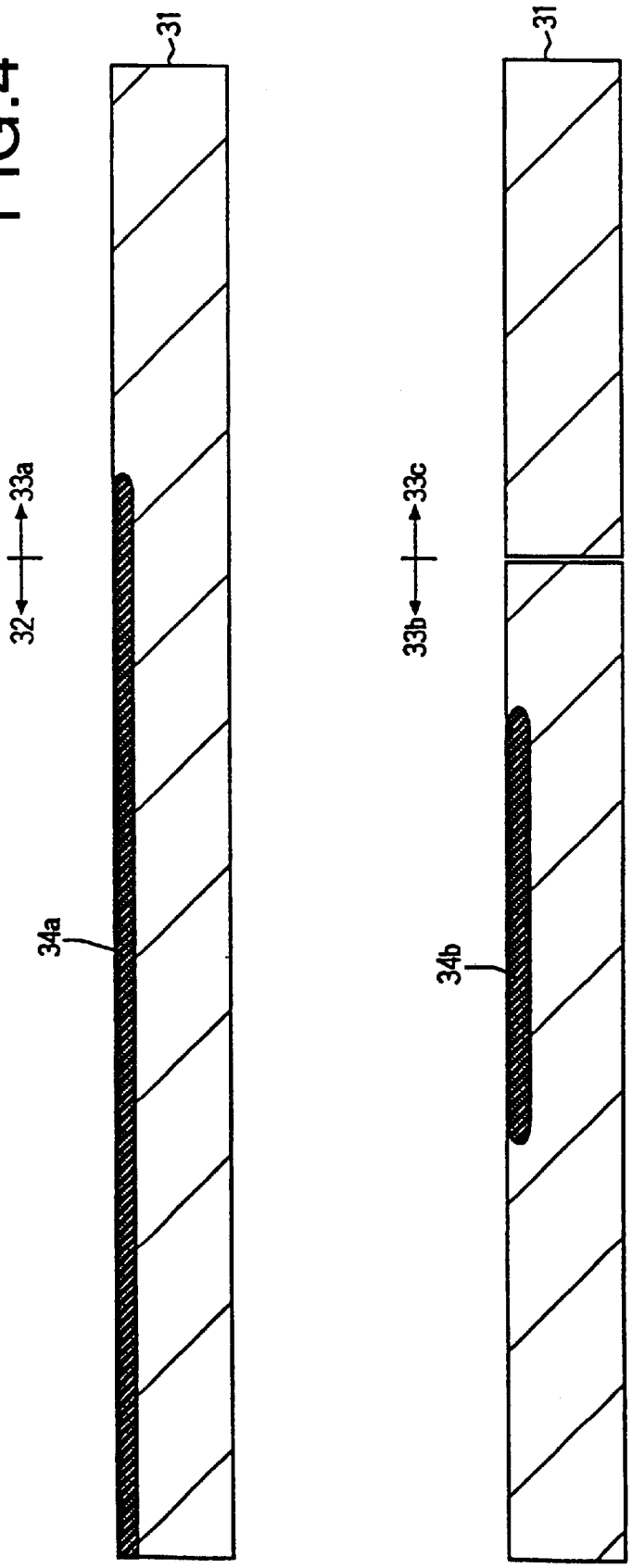
FIG. 4 is a side sectional view showing the first fabrication step of the embodiment.

The embodiment of the present invention applied to the high-resistance load type SRAM shown in FIGS. 1 to 3 and a method of fabricating the same will be described below with reference to FIGS. 1 to 17. Note that the equivalent circuit of the memory cell of the high-resistance load type SRAM according to this embodiment is as already shown in FIG. 18. In order to fablicate the high-resistance load type SRAM according to this embodiment, as shown in FIG. 4, a 400-nm thick $SiO_2$ layer (not shown) is formed by thermal oxidation on the surface of a P-type Si substrate 31.

Thereafter, the $SiO_2$ layer is selectively etched in an entire memory cell region 32, in a portion which is a part of a peripheral circuit region 33a adjacent to the memory cell region 32 and which is in contact with the memory cell region 32, and in a portion which is a part of a peripheral circuit region 33b for forming a bipolar transistor and in which a buried collector region is to be formed, thereby forming openings. No opening is formed in a peripheral circuit region 33c for forming a MOS transistor.

Subsequently, the $SiO_2$ layer is used as a mask to diffuse Sb in the Si substrate 31, thereby selectively forming N-type diffusion layers 34a and 34b in the surface portions of the Si substrate 31 of the memory cell region 32 and the peripheral circuit regions 33a and 33b. Note that the diffusion layers 34a and 34b can also be formed by ion implantation. Thereafter, an antimony glass layer formed by the doping of Sb in the $SiO_2$ layer is removed by, e.g., etching using buffer hydrofluoric acid.

Figure 5:
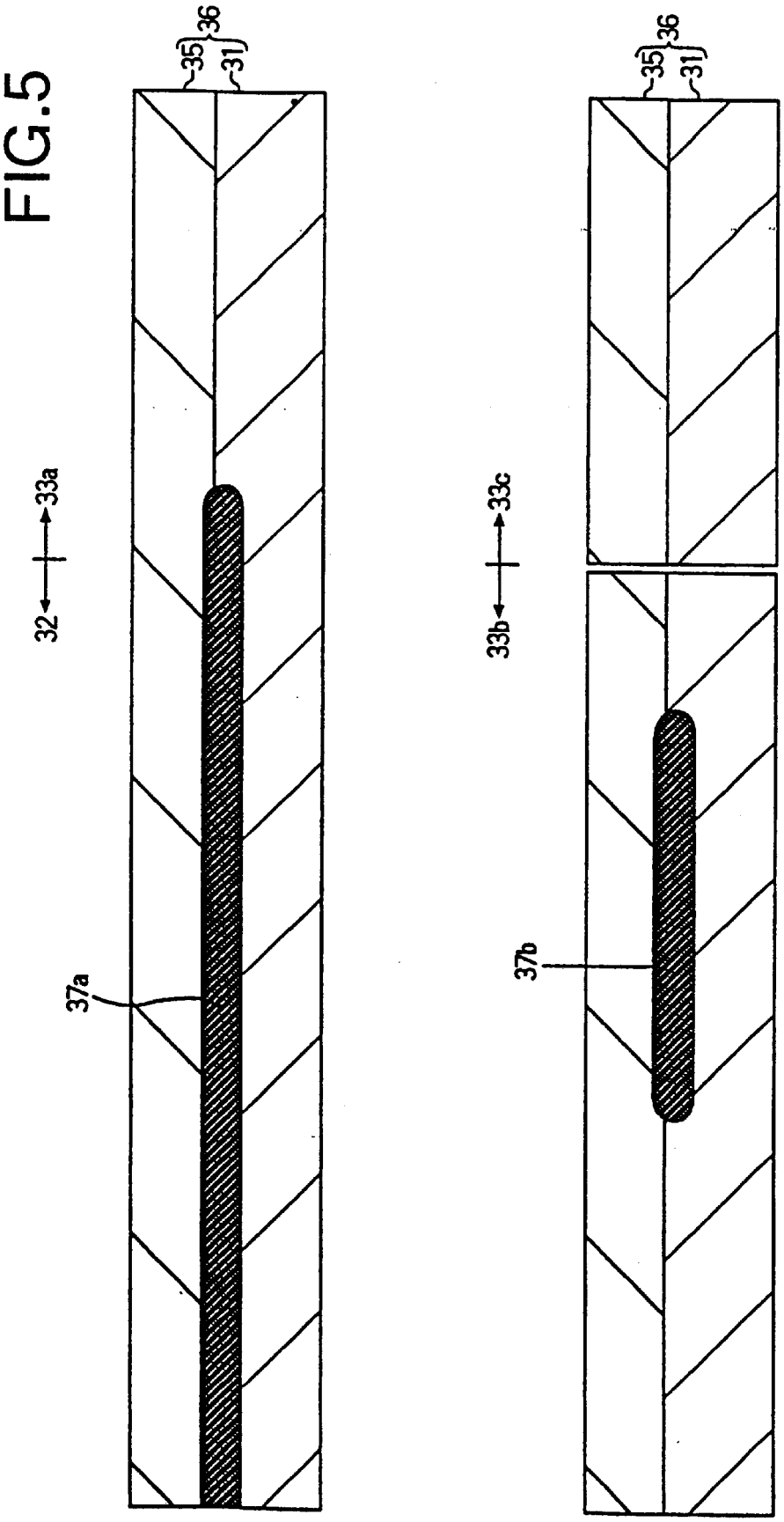
FIG. 5 is a side sectional view showing the step subsequent to FIG. 4.

Subsequently, as shown in FIG. 5, P-doped $SiH_2Cl_2$ is used as a grow gas to epitaxially grow a 0.5- to 1.0- m thick N-type single-crystal Si layer 35 on the Si substrate 31. Consequently, an Si base 36 is formed by the Si substrate 31 and the single-crystal Si layer 35, and the diffusion layers 34a and 34b are converted into buried diffusion layers 37a and 37b.

Figure 6:
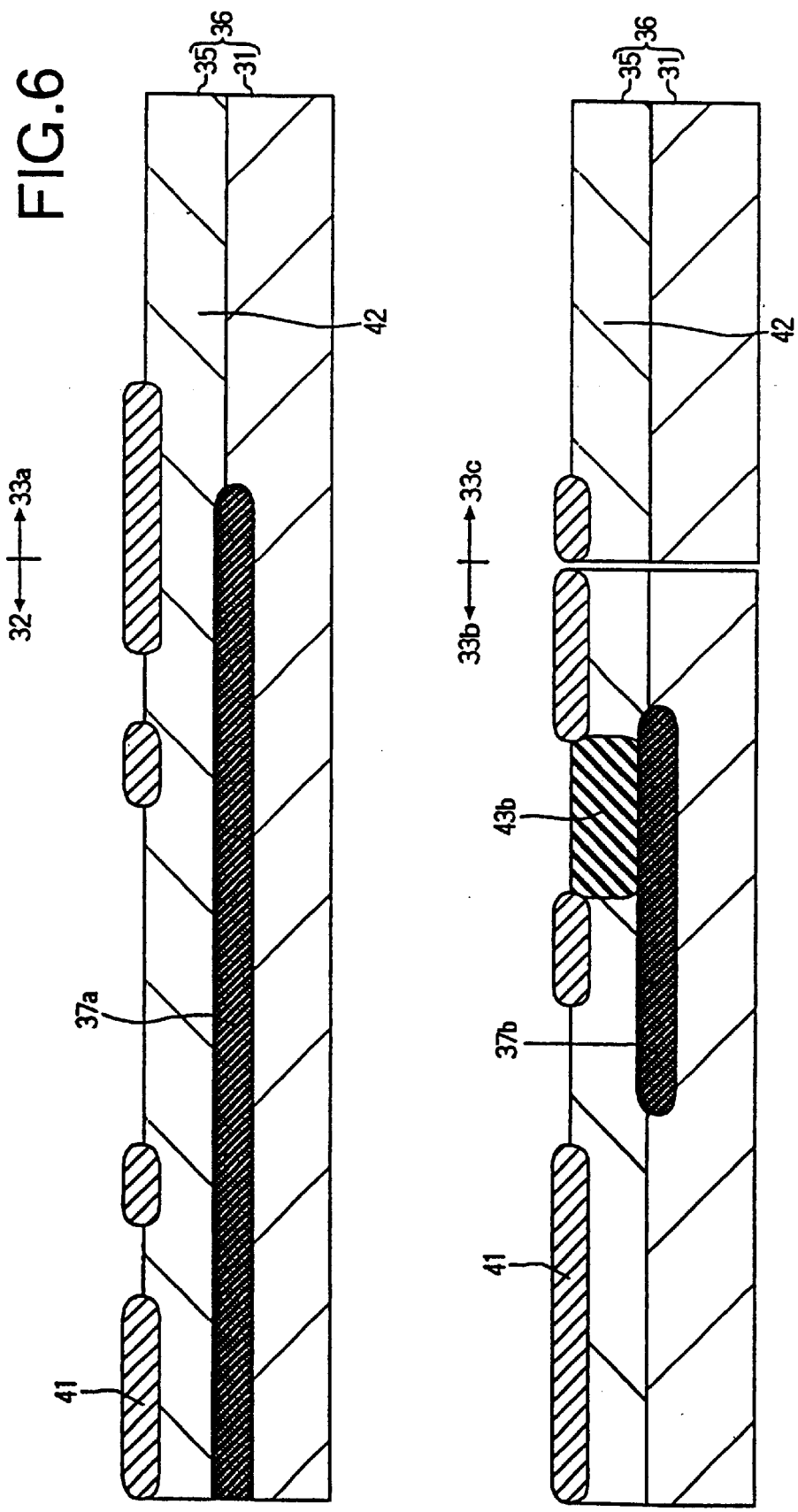
FIG. 6 is a side sectional view showing the step subsequent to FIG. 5.

As shown in FIG. 6, a 400-nm thick $SiO_2$ layer 41 is selectively formed on the surface of the Si base 36 by a LOCOS process to partition an isolation region. Thereafter, B is selectively ion-implanted into the single-crystal Si layer 35 to form a P-type well region 42 in a region where MOS transistors are to be formed and form a P-type isolation region (not shown) for isolating bipolar transistors by a PN junction in a region where the bipolar transistors are to be formed.

The mask (not shown) used in the ion implantation for forming the well region 42 and the isolation region is again used to ion-implant $2 \times 10^{12}$ cm$^{-2}$ of B into the regions where MOS transistors are to be formed, i.e., the memory cell region 32 and the peripheral circuit regions 33a and 33c.

The mask (not shown) covering the peripheral circuit regions 33a to 33c is used to again ion-implant $1 \times 10^{12}$ cm$^{-2}$ of B only into the memory cell region 32. Consequently, the threshold voltage of a MOS transistor to be formed in the memory cell region 32 is adjusted to 0.6 V, and the threshold voltage of MOS transistors to be formed in the peripheral circuit regions 33a and 33c is adjusted to 0.45 V.

Thereafter, P is selectively ion-implanted into the single-crystal Si layer 35 to form a plug region 43a (FIG. 3) connected to the buried diffusion layer 37a and exposed to the surface of the Si base 36 and a plug region 43b connected to the buried diffusion layer 37b and exposed to the surface of the Si base 36.

In the above step shown in FIG. 6, the plug regions 43a and 43b are formed after the well region 42 and the isolation region are formed and the threshold voltages of the MOS transistors to be formed in the memory cell region 32 and the peripheral circuit regions 33a and 33c are adjusted. However, this order can also be reversed.

Figure 7:
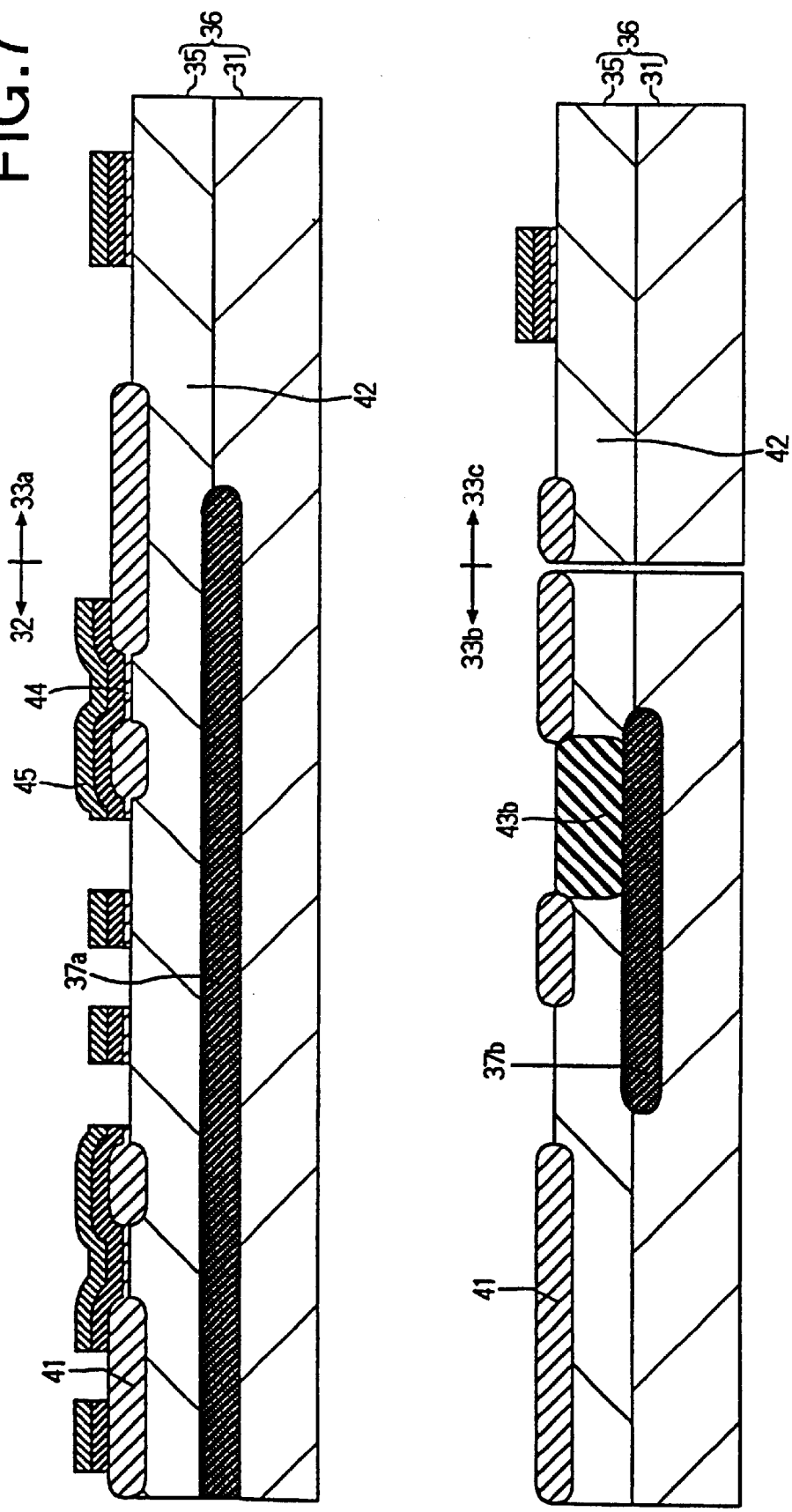
FIG. 7 is a side sectional view showing the step subsequent to FIG. 6.

Subsequently, as shown in FIG. 7, an $SiO_2$ layer 44 as a gate oxide film is formed on the surface of an active region surrounded by the $SiO_2$ layer 41. A polycrystalline Si layer and a silicide layer both having a thickness of 70 to 150 nm are sequentially deposited by CVD or sputtering, thereby forming a polycide layer 45. This polycide layer 45 is processed into the pattern of a gate electrode of the MOS transistor.

Figure 8:
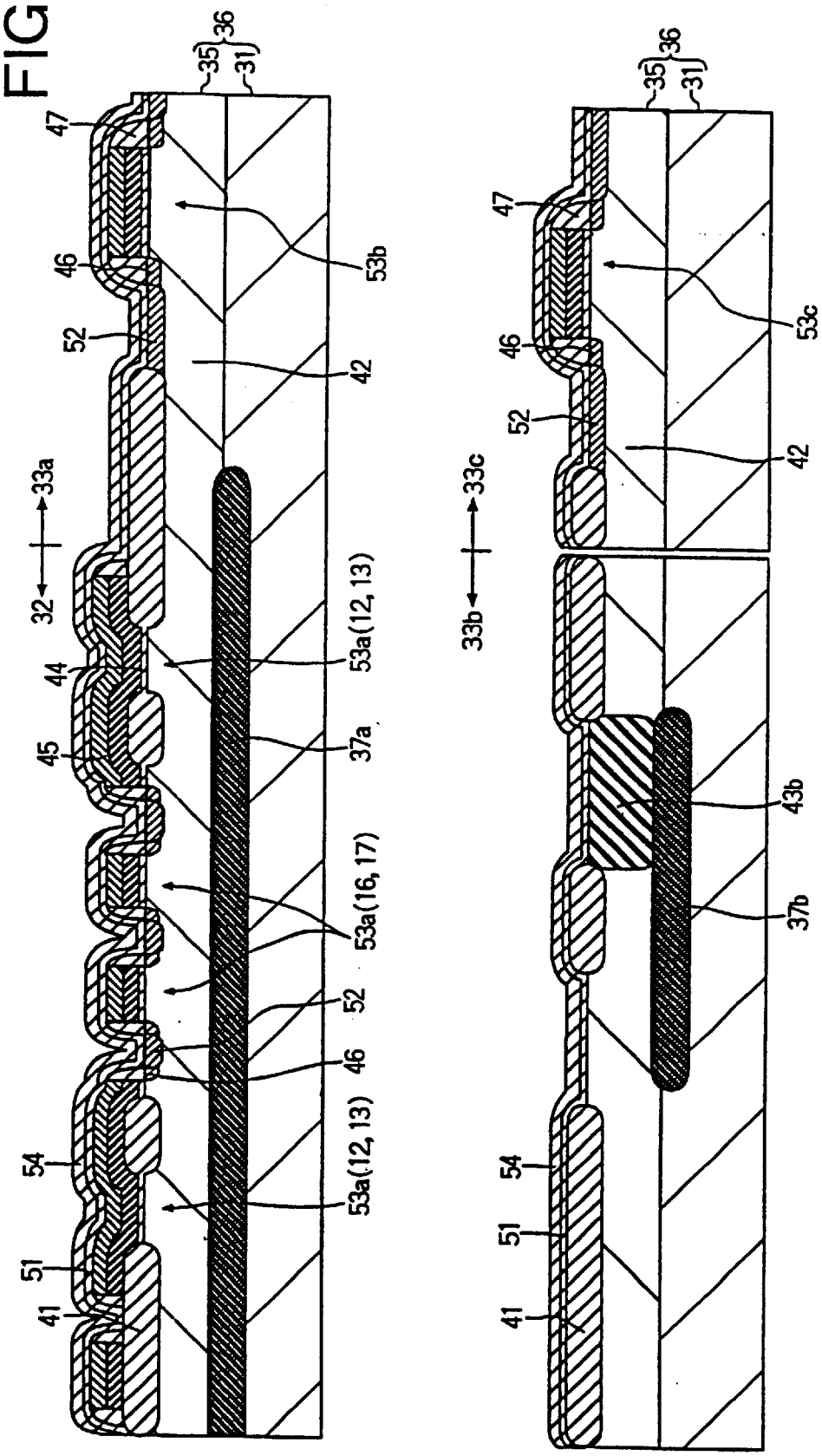
FIG. 8 is a side sectional view showing the step subsequent to FIG. 7.

As shown in FIG. 8, the polycide layer 45 and the $SiO_2$ layer 41 are used as masks to ion-implant As into the memory cell region 32 and the peripheral circuit regions 33a and 33c, forming an N-type lightly doped diffusion layer 46. An $SiO_2$ layer 47 is deposited, and the entire surface of the $SiO_2$ layer 47 is etched back to form sidewall spacers made from the $SiO_2$ layer 47 on the side surfaces of the polycide layer 45.

Thereafter, a thin $SiO_2$ layer 51 is deposited, and the polycide layer 45 and the $SiO_2$ layers 41 and 47 are used as masks to ion-implant As into the memory cell region 32 and the peripheral circuit regions 33a and 33c, forming an N-type heavily doped diffusion layer 52. As a consequence, N-type MOS transistors 53a to 53c with an LDD structure having the diffusion layers 46 and 52 as the source/drain region are formed in the memory cell region 32 and the peripheral circuit regions 33a and 33c.

Next, an $SiO_2$ layer 54 is deposited to form an interlayer insulator by the $SiO_2$ layers 51 and 54. Note that since the ion implantation for forming the diffusion layer 52 is performed via the thin $SiO_2$ layer 51, channeling can be prevented, so a shallow diffusion layer 52 can be formed.

Figure 9:
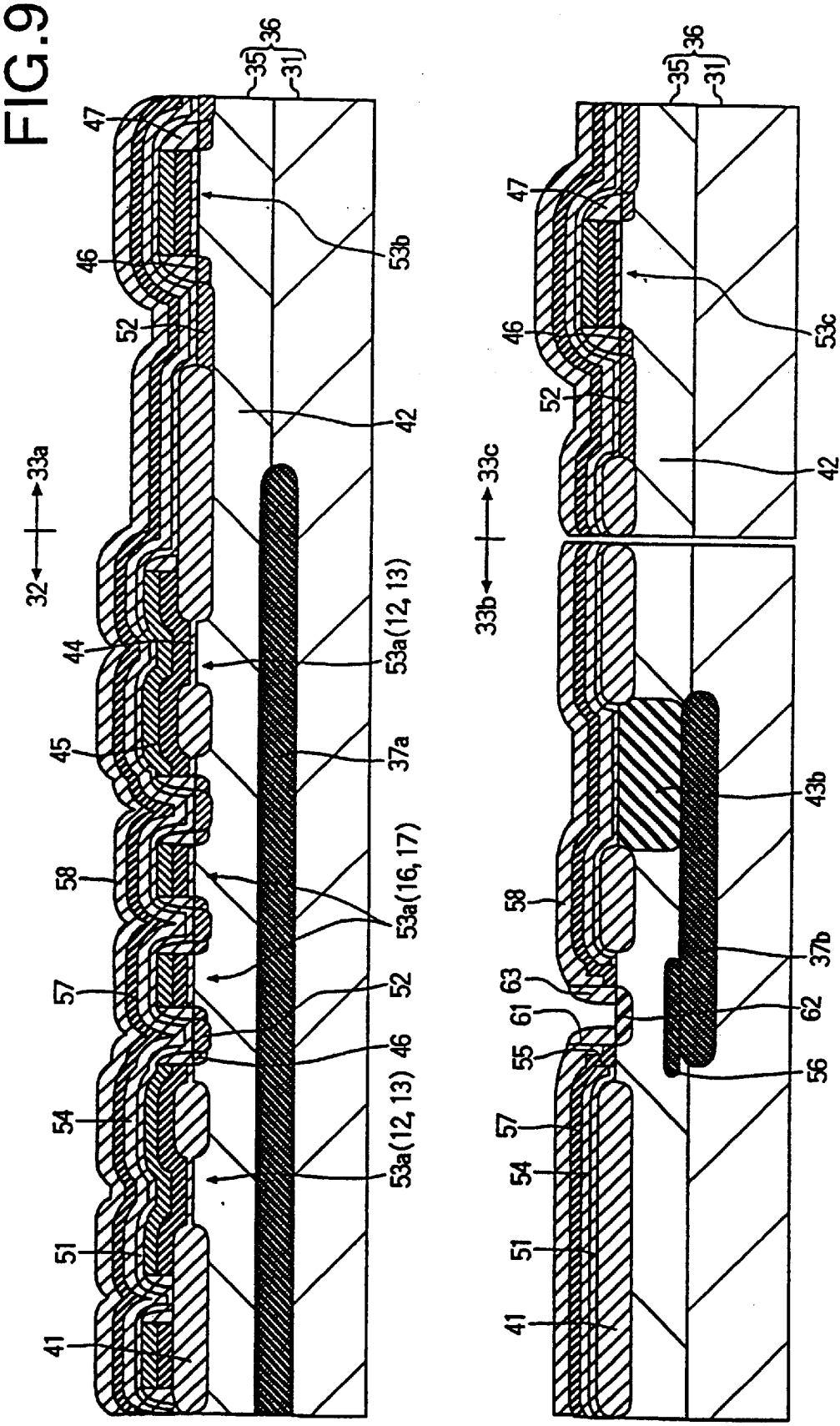
FIG. 9 is a side sectional view showing the step subsequent to FIG. 8.

Subsequently, as shown in FIG. 9, an opening 55 for exposing the Si base 36 in a portion of the peripheral circuit region 33b where the base region is to be formed is formed in the $SiO_2$ layers 51 and 54. By ion implantation using these $SiO_2$ layers 51 and 54 as masks, an N-type SIC (Selectively Implanted Collector) region 56 is formed on the buried diffusion layer 37a. With this SIC region 56, it is possible to reduce the collector resistance and control the base width.

Thereafter, a 100- to 200-nm thick polycrystalline Si layer 57 is deposited by CVD, and B is ion-implanted into this polycrystalline Si layer 57. A 100- to 200-nm thick $SiO_2$ layer 58 is then deposited by low-pressure CVD using TEOS as a material. Note that instead of the polycrystalline Si layer 57, it is also possible to use a polycide layer formed by sequentially depositing a 50- to 100-nm thick polycrystalline Si layer and a 40- to 100-nm thick silicide layer by, e.g., CVD or sputtering.

An opening 61 for exposing the Si base 36 in a portion of the peripheral circuit region 33b where an inner base region is to be formed is formed in the $SiO_2$ layer 58 and the polycrystalline Si layer 57. The $SiO_2$ layer 58 and the like are used as masks to ion-implant B into a shallow region in the opening 61, forming an inner base region 62.

Next, a 100- to 500-nm thick $SiO_2$ layer 63 is deposited by low-pressure CVD using TEOS as a material or atmospheric pressure CVD using $SiH_4$ or the like as a material. The entire surface of this $SiO_2$ layer 63 is etched back to form sidewall spacers made from the $SiO_2$ layer 63 on the inner side surfaces of the opening 61.

Figure 10:
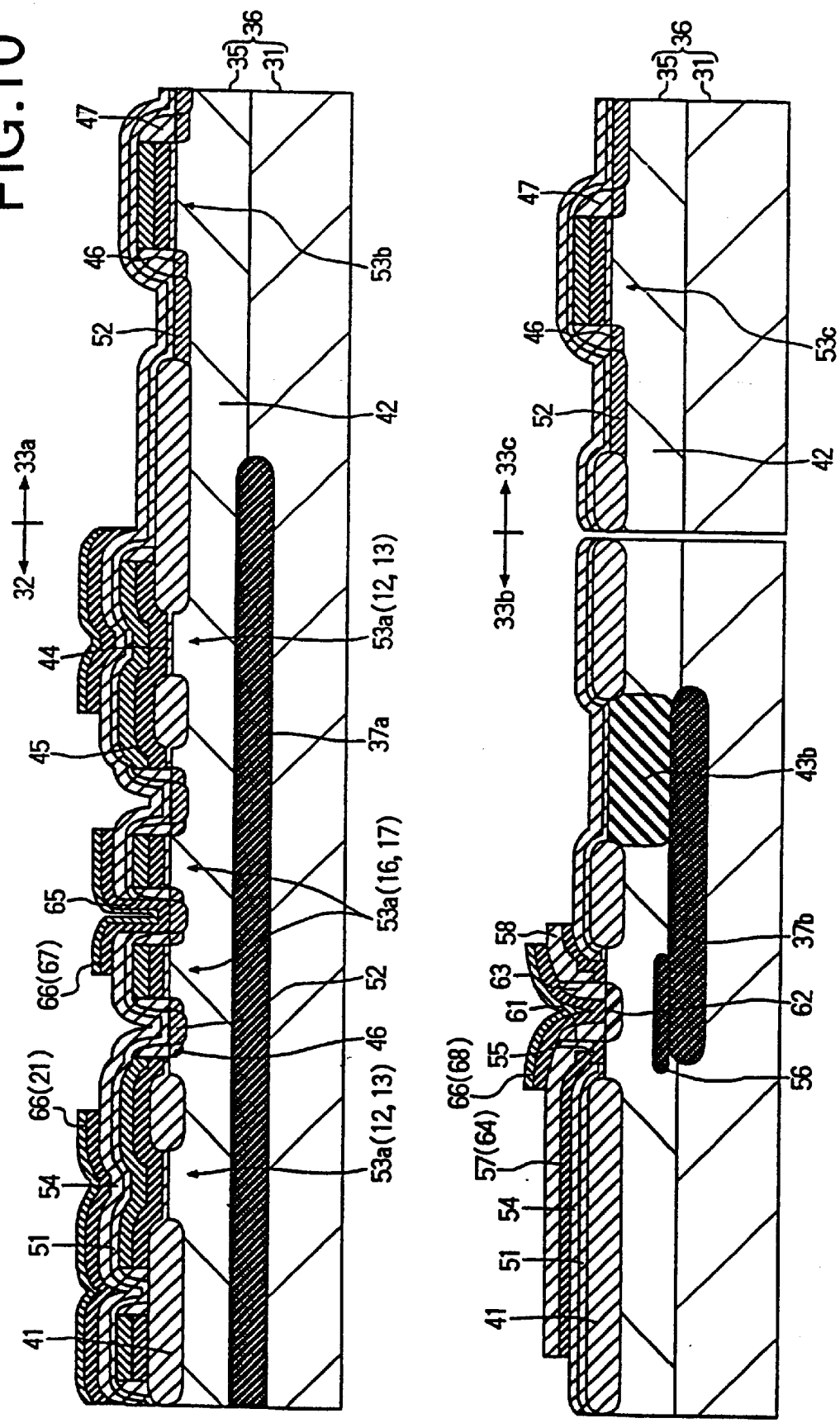
FIG. 10 is a side sectional view showing the step subsequent to FIG. 9.

As shown in FIG. 10, the $SiO_2$ layer 58 is processed into the pattern of a base electrode by etching using the polycrystalline Si layer 57 as a stopper. In addition, the polycrystalline Si layer 57 is removed by etching using the $SiO_2$ layer 58 as a mask to form a base electrode 64 by this polycrystalline Si layer 57. A contact hole 65 reaching the diffusion layer 52 serving as one of the source/drain regions of NMOS transistors 16 and 17 is formed in the $SiO_2$ layers 54 and 51 in the memory cell region 32.

Thereafter, a 50- to 100-nm thick polycrystalline Si layer is deposited, and As is ion-implanted into this polycrystalline Si layer. In addition, a 50- to 100-nm thick WSi layer is deposited to form a polycide layer 66 by these polycrystalline Si layer and WSi layer. This polycide layer 66 is patterned to form a ground line 21 and fetch electrodes 67 for bit lines 24 and 25 in the memory cell region 32 and an emitter electrode 68 in the peripheral circuit region 33b.

Figure 11:
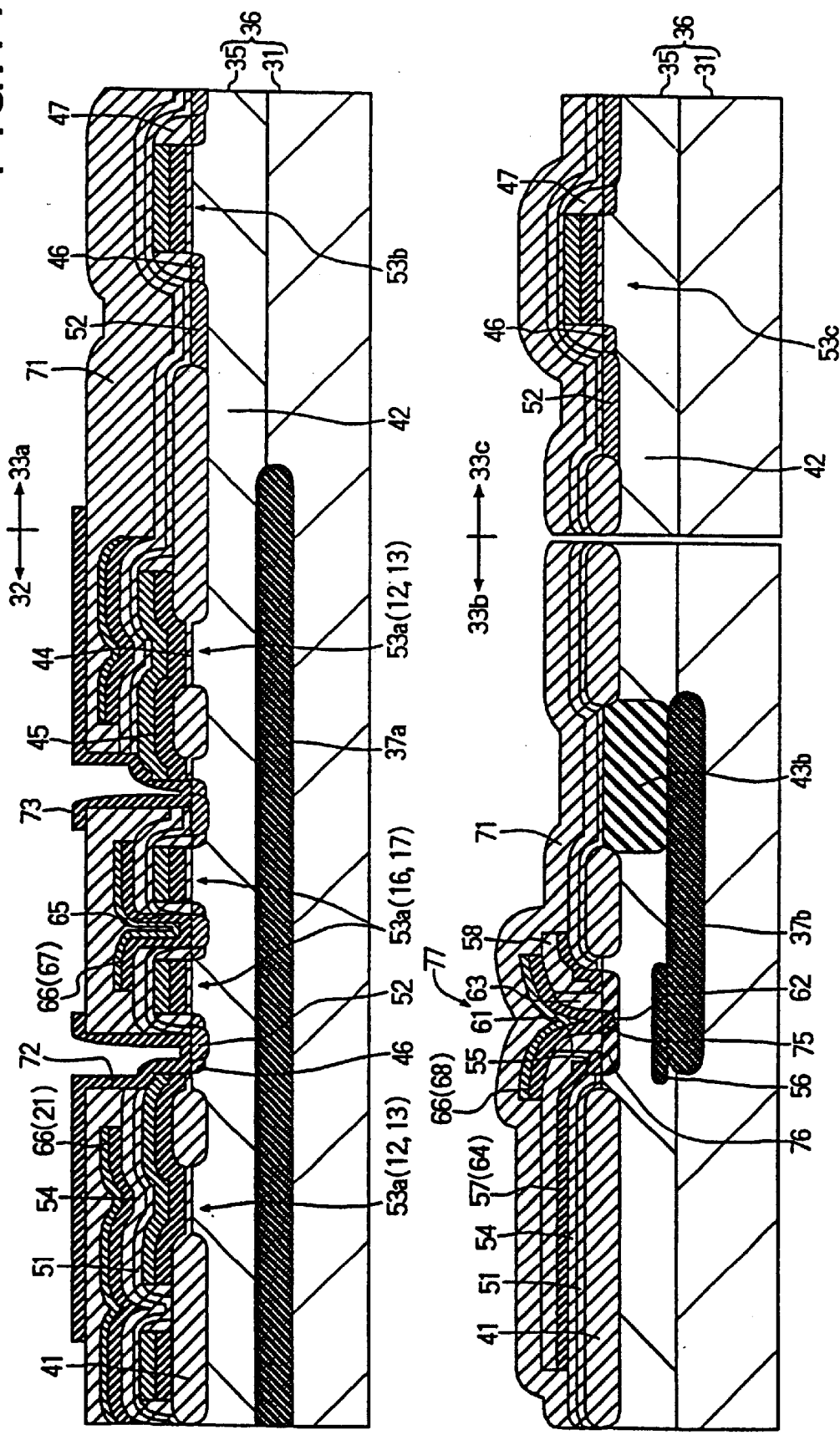
FIG. 11 is a side sectional view showing the step subsequent to FIG. 10.

Subsequently, as shown in FIG. 11, an $SiO_2$ layer 71 or the like is deposited to form an interlayer insulator. Halogen lamp annealing is then performed at 1050 to 1150° C. for 5 to 15 sec. Consequently, the B in the inner base region 62 is activated. Simultaneously, As is diffused from the polycide layer 66 as the emitter layer 68 into the single-crystal Si layer 35 and activated to form an emitter region 75. Additionally, B is diffused from the polycrystalline Si layer 57 as the base electrode 64 into the single-crystal Si layer 35 and activated to form an outer base region 76.

As a consequence, an NPN bipolar transistor 77 is formed in the peripheral circuit region 33b. Then, a contact hole 72 is formed in the $SiO_2$ layers 71, 54, 51 and the like in the memory cell region 32. This contact hole 72 reaches the polycide layer 45 as the gate electrode of NMOS transistors 12 and 13 and the diffusion layers 46 and 52 which are used as the drain regions of the NMOS transistors 12 and 13 and as the other of the source/drain regions of the NMOS transistors 16 and 17 and serve as storage node diffusion layers.

Figure 12:
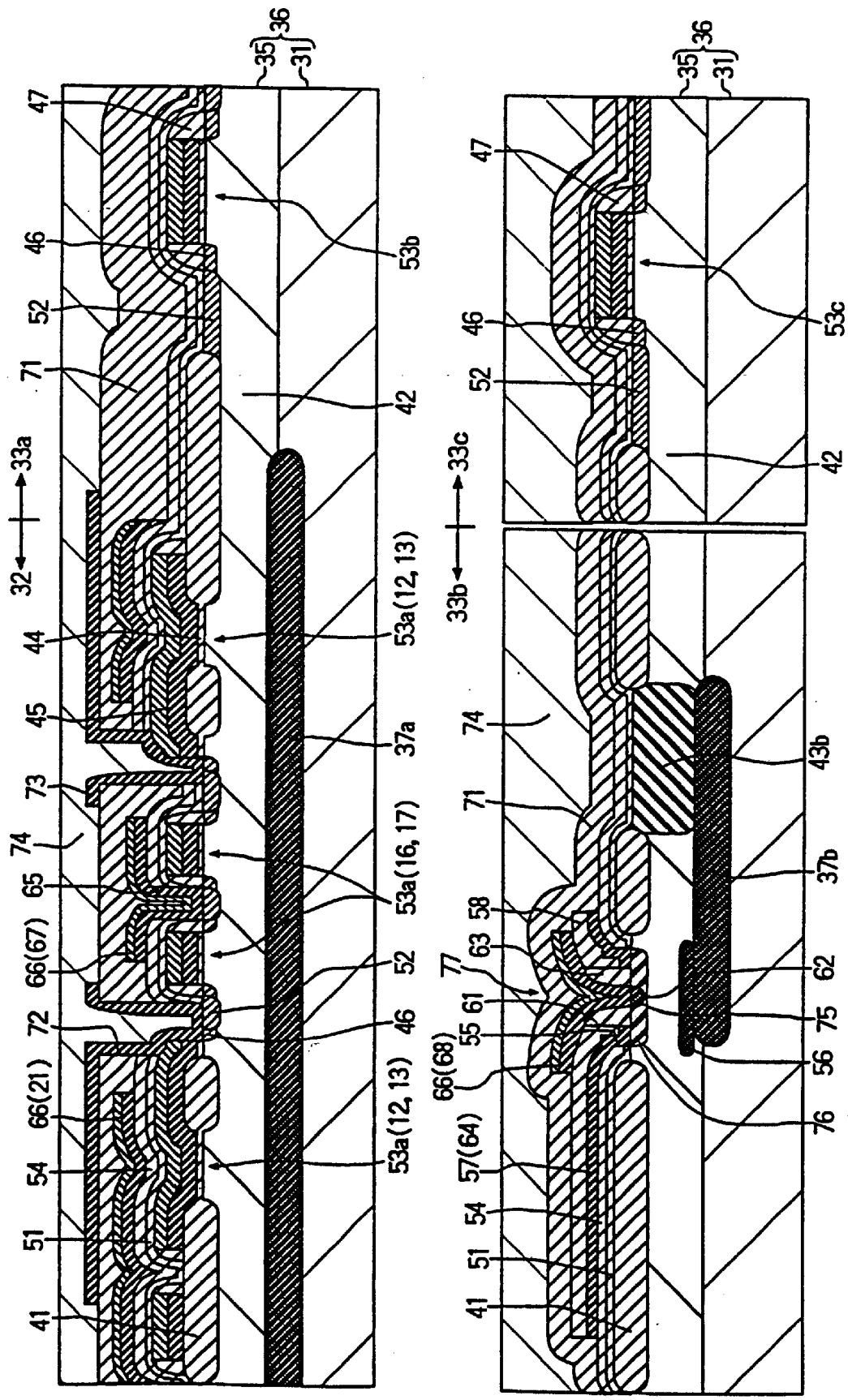
FIG. 12 is a side sectional view showing the step subsequent to FIG. 11.

Thereafter, a polycrystalline Si layer 73 is deposited and processed into the patterns of resistive elements 14 and 15 and a power line 22. P is ion-implanted into a portion near the contact hole 72 and a portion to be used as the power line 22 of the polycrystalline Si layer 73, thereby lowering the resistance of these portions. As shown in FIG. 12, a BPSG layer 74 or the like is deposited to form an interlayer insulator, and the surface of the BPSG layer 74 is planarized by, e.g., reflow.

Note that during annealing for this reflow, the P already ion-implanted into the portion of the polycrystalline Si layer 73 near the contact hole 72 well diffuses into the single-crystal Si layer 35. Compared to the diffusion layers 46 and 52 made only from As, changes in the impurity concentration in the diffusion layers 46 and 52 facing the contact hole 72 and serving as the storage node diffusion layers are moderated.

As shown in FIGS. 1 to 3, a contact hole 78 is selectively formed and buried with a barrier metal layer 81 and a tungsten plug 82. A barrier metal layer 83, an Al layer 84 containing Cu, and an antireflection layer 85 are sequentially deposited and processed into the patterns of the bit lines 24 and 25 and other lines.

Thereafter, an interlayer insulator (not shown) and a second Al layer (not shown) are formed. Additionally, an SiN film 86 as a passivation film is deposited by plasma CVD to complete the high-resistance load type SRAM of this embodiment. Note that FIG. 3 shows a portion of the memory cell region 32 in which the plug region 43a is formed, and the rest of the memory cell region 32 has the structure shown in FIG. 1.

When the high-resistance load type SRAM of this embodiment is in operation, a power-supply voltage of, e.g., 3.3 V is applied to the buried diffusion layer 37a via the plug region 43a. Therefore, the buried diffusion layer 37a serves as a potential groove for electrons generated by impact ionization by a rays entering into the Si base 36. Consequently, the electrons generated by the impact ionization are not easily trapped in the diffusion layers 46 and 52 in the memory cell region 32.

Figure 13:
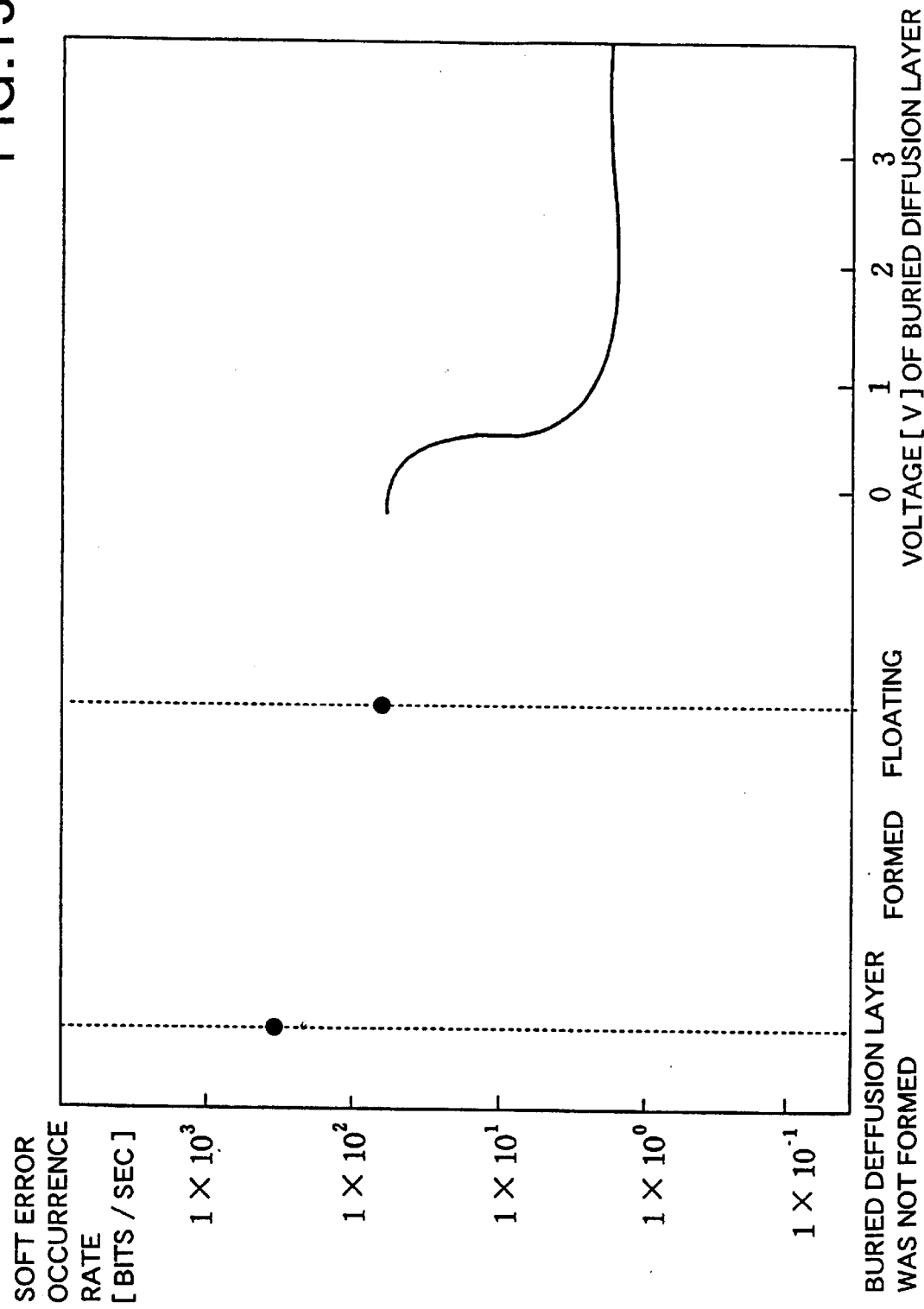
FIG. 13 is a graph showing the relationship between the voltage applied to a buried diffusion layer and the soft error occurrence rate.

FIG. 13 shows the relationship between the voltage applied to the buried diffusion layer 37a and the soft error occurrence rate. It is evident from FIG. 13 that the soft error occurrence rate when a voltage of about 1 V or more is applied to the buried diffusion layer 37a is lower than that when the buried diffusion layer 37a is not formed or when the buried diffusion layer 37a floats or is grounded.

Figure 14:
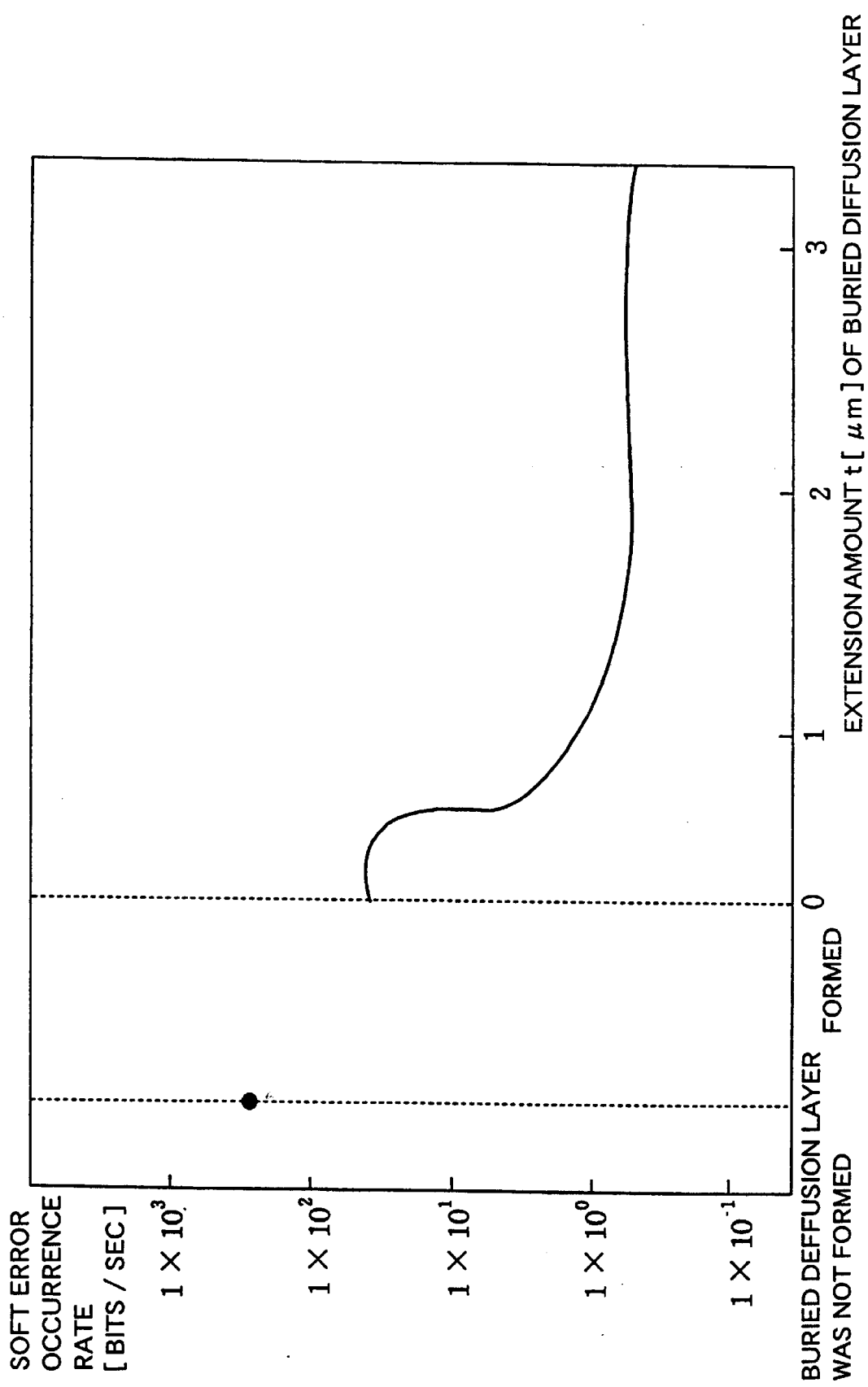
FIG. 14 is a graph showing the relationship between an extension amount t of the buried diffusion layer from the memory cell region into the peripheral circuit region and the soft error occurrence rate.

Meanwhile, as shown in FIG. 1, the buried diffusion layer 37a extends by t from the memory cell region 32 into the peripheral circuit region 33a. FIG. 14 shows the relationship between this projection amount t and the soft error occurrence rate in the peripheral portion of the memory cell region 32.

FIG. 14 reveals that the soft error occurrence rate in the peripheral portion of the memory cell region 32 decreases when the extension amount t is 0.5 $\mu$m or more. However, this decrease in the soft error occurrence rate is saturated when the projection amount t is 2 $\mu$m. Accordingly, the projection amount t is preferably 2 $\mu$m or less in order to suppress an increase in the necessary area of the memory cell region 32 and suppress a decrease in the integration degree.

To reduce nonuniform processing of a pattern due to difference in pattern density, a region called a dummy memory cell region which does not perform storage operation is sometimes formed in the outer peripheral portion of an essential memory cell region which performs storage operation. If this is the case, the memory cell region 32 extended by 0.5 to 2 $\mu$m means the essential memory cell not including the dummy memory cell region.

In this embodiment, the soft error resistance is increased by using the N-type buried diffusion layer 37a as a potential groove for electrons as described above. To form this buried diffusion layer 37a, as shown in FIGS. 4 and 5, after the diffusion layer 34a is formed in the surface portion of the Si substrate 31, the single-crystal Si layer 35 is epitaxially grown on the Si substrate 31.

Figure 15:
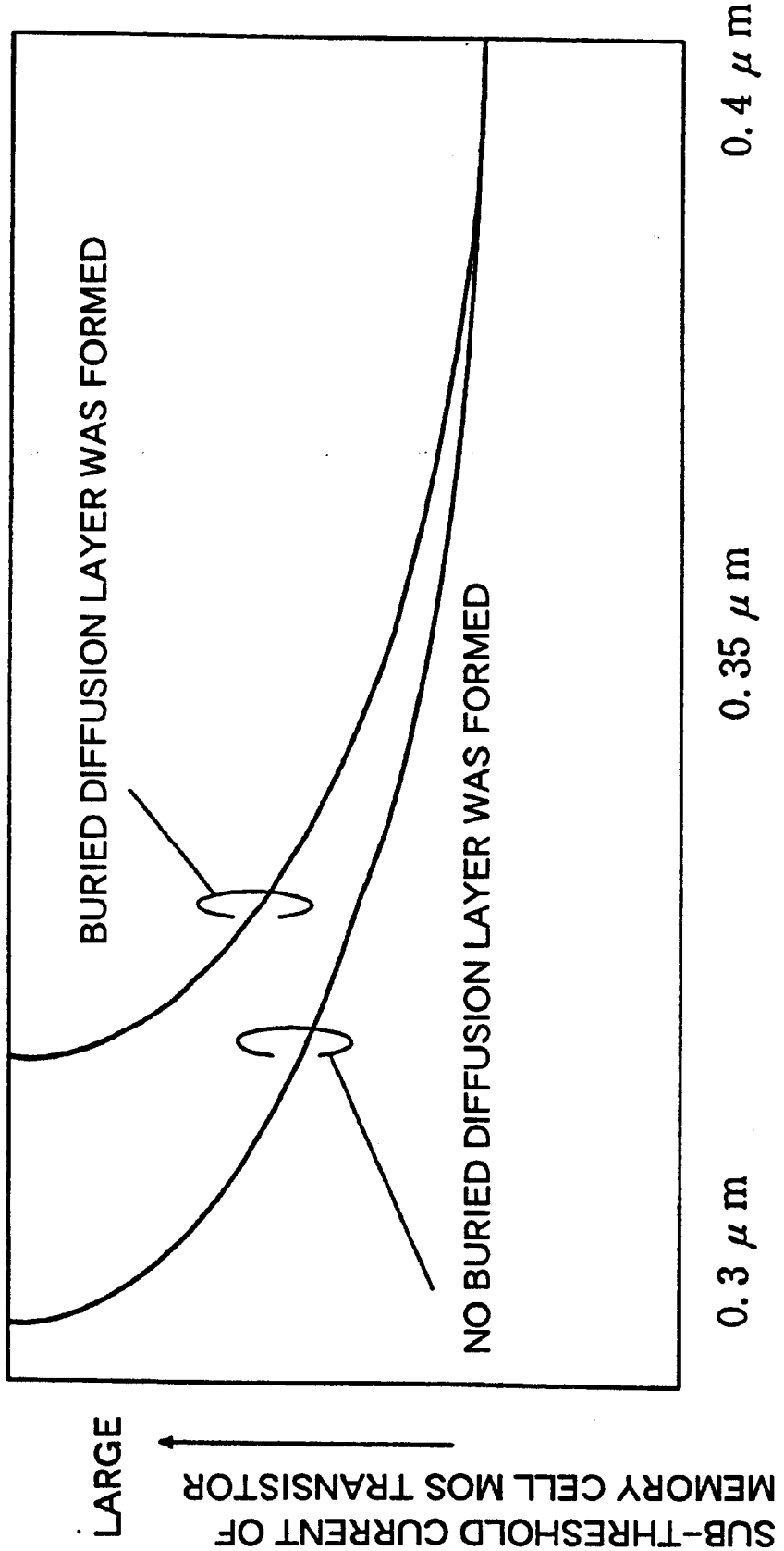
FIG. 15 is a graph showing the relationship between the gate length and the sub-threshold current of a MOS transistor in the memory cell region.

For this reason, if the buried diffusion layer 37a is simply formed in the memory cell region 32, the Sb in the diffusion layer 37a diffuses upward due to high-temperature annealing during the epitaxial growth. Consequently, as shown in FIG. 15, the sub-threshold current in the MOS transistor 53a in the memory cell region 32 increases.

In a semiconductor storage device such as an SRAM, if the sub-threshold current in a MOS transistor constituting a memory cell increases, it is necessary to also increase the current which can be supplied by, e.g., a resistive element or a thin-film transistor as a load element of an inverter constituting the memory cell, in order to ensure stable storage operation. As a consequence, the standby current increases to increase the consumption power.

In this embodiment, however, as already described above in the step shown in FIG. 6, the threshold voltage of the MOS transistor 53a in the memory cell region 32 is adjusted to 0.6 V, and the threshold voltages of the MOS transistors 53b and 53c in the peripheral circuit regions 33a and 33c are adjusted to 0.45 V. Consequently, a high-speed operation is achieved by the MOS transistors 53b and 53c while an increase in the consumption power due to an increase in the standby current of th e MOS transistor 53a is suppressed.

Figure 16:
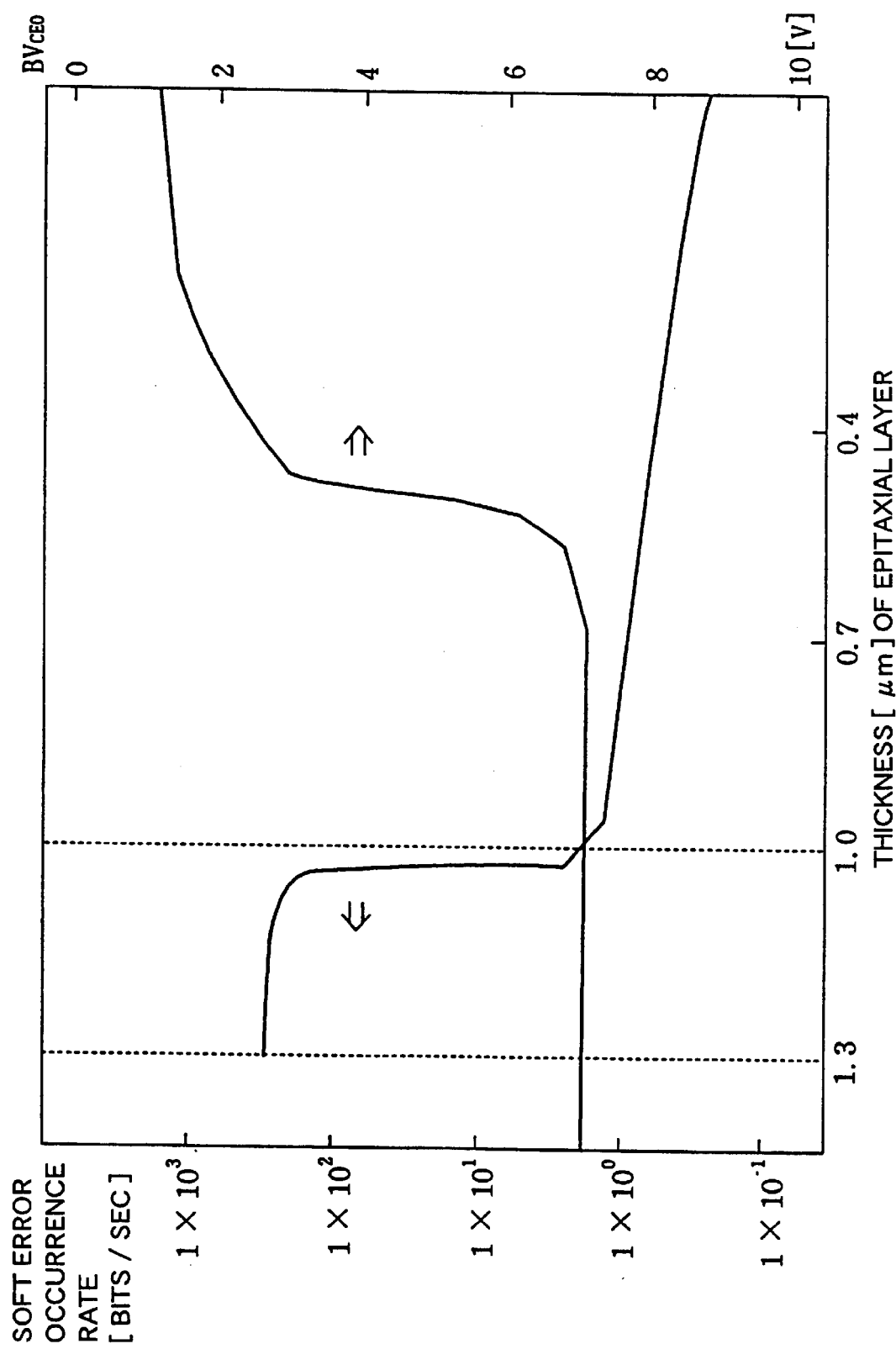
FIG. 16 is a graph showing the relationship between the thickness of an epitaxial layer, and the soft error occurrence rate and an open-base, grounded-emitter maximum collector voltage $BV_{CEO}$.

FIG. 16 shows the relationship between the thickness of the single-crystal Si layer 35 as an epitaxial layer on the Si substrate 31, and the soft error occurrence rate and an open-base, grounded-emitter maximum collector voltage $BV_{CEO}$ of the bipolar transistor 77. As is apparent from FIG. 16, the smaller the thickness of the single-crystal Si layer 35, the lower the soft error occurrence rate. Conversely, the larger the thickness of the single-crystal Si layer 35, the higher the $BV_{CEO}$. This $BV_{CEO}$ is preferably 6.0 V or more and must be at least 3.3 V.

It is, therefore, evident from FIG. 16 that when the thickness of the single-crystal Si layer 35 is 0.5 to 1 $\mu$m as in this embodiment, the soft error occurrence rate is low and the $BV_{CEO}$ meets the above condition. Although not shown in FIG. 16, a collector current $I_C$ of the bipolar transistor 77, particularly a so-called Knee current which is a collector current $I_C$ when grounded-emitter forward current amplification factor $h_{fe}$=50 is also a maximum when the $BV_{CEO}$ meets the above condition.

Figure 17:
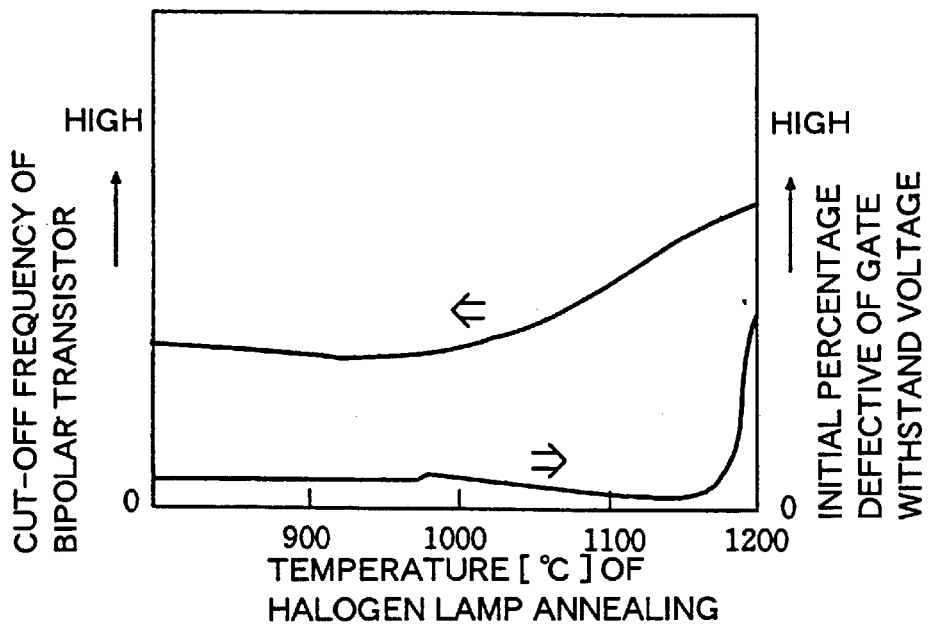
FIG. 17 is a graph showing the relationship between the temperature of halogen lamp annealing, and the initial percent defective of the gate withstand voltage of a MOS transistor and the cut-off frequency of a bipolar transistor.
Figure 18:
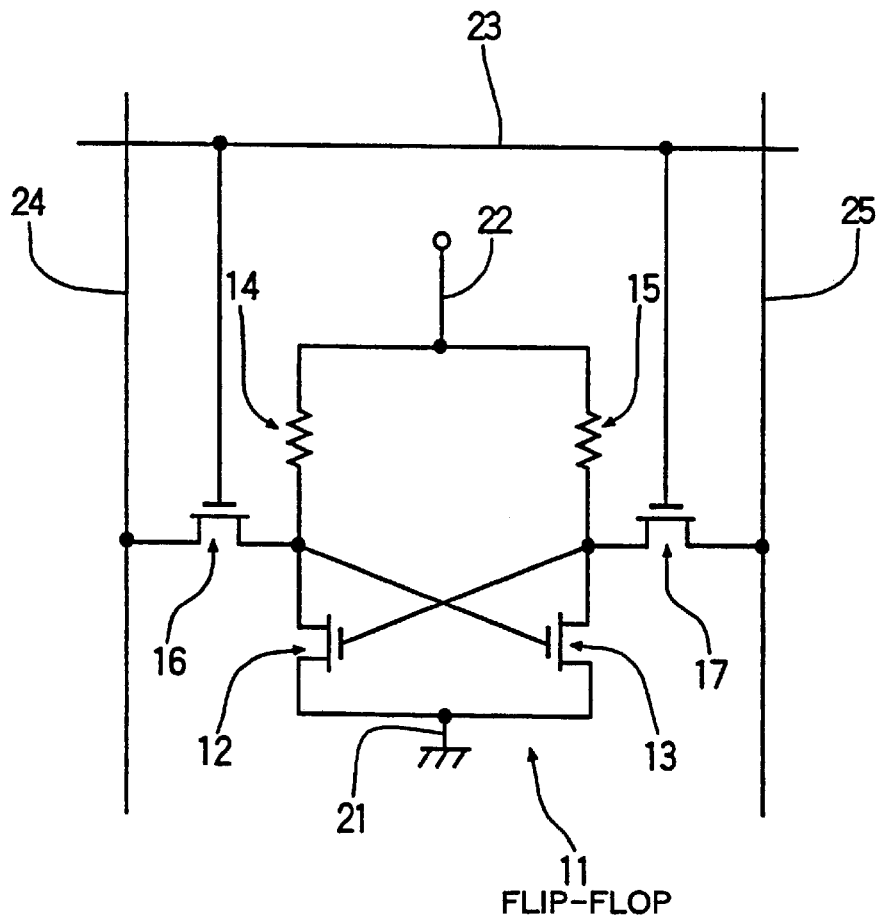
FIG. 18 is an equivalent circuit diagram of a memory cell of a high-resistance load type SRAM to which the present invention is applicable.

FIG. 17 shows the relationship between the temperature of halogen lamp annealing performed in the step shown in FIG. 11 to activate B in the inner base region 62 and form the emitter region 75 and the outer base region 76, and the initial percentage defective of the gate withstand voltage in the MOS transistors 53a to 53c and the cut-off frequency of the bipolar transistor 77.

As can be seen from FIG. 17, when the temperature of halogen lamp annealing is 1000 to 1150° C., the base width of the bipolar transistor 77 can be accurately controlled, and the high-frequency characteristics such as the cut-off frequency are excellent. Additionally, since it is possible to prevent deterioration of the $SiO_2$ layer 44 as a gate oxide film of the MOS transistors 53a to 53c, the initial percentage defective of the gate withstand voltage is low.

In a conventional high-resistance load type SRAM, As having a small diffusion coefficient is ion-implanted, as in the diffusion layers 46 and 52, in a portion near the contact hole 72 of the polycrystalline Si layer 73 as the resistive elements 14 and 15. Accordingly, changes in the impurity concentration in the diffusion layers 46 and 52 as storage node diffusion layers are steep.

In this embodiment, however, P having a large diffusion coefficient is ion-implanted in a portion near the contact hole 72 of the polycrystalline layer 73 as the resistive elements 14 and 15. Therefore, as already described above, changes in the impurity concentration in the diffusion layers 46 and 52 are moderate, and the junction leakage in the diffusion layers 46 and 52 is small. Consequently, the amount of electric charge stored in these diffusion layers 46 and 52 as storage node diffusion layers does not easily vary, so the potential of the diffusion layers 46 and 52 is not easily inverted. This improves the storage retention characteristics of the memory cell.

Although P having a large diffusion coefficient is ion-implanted in a portion near the contact hole 72 of the polycrystalline Si layer 73 serving as the resistive elements 14 and 15, the resistive elements 14 and 15 are formed after halogen lamp annealing is performed to activate B in the inner base region 62 and form the emitter region 75 and the outer base region 76. Consequently, it is possible to prevent diffusion of P in the polycrystalline Si layer 73 and prevent variations in the characteristics of the resistive elements 14 and 15.

That is, in the high-resistance load type SRAM of this embodiment, the characteristics of all of the bipolar transistor 77, the resistive elements 14 and 15 and the MOS transistors 53a to 53c are excellent.

In the above embodiment, the present invention is applied to a high-resistance load type SRAM and a method of fabricating the same. However, the present invention is also applicable to a TFT load type SRAM and a method of fabricating the same. If this is the case, P is ion-implanted in a polycrystalline Si layer as a gate electrode of a TFT (Thin-Film Transistor), instead of a portion near the contact hole 73 of the polycrystalline Si layer 73 as the resistive elements 14 and 15 in the above embodiment.

It is also possible to perform rapid thermal annealing other than halogen lamp annealing in place of halogen lamp annealing in the above embodiment. Furthermore, the present invention can be applied to an ASIC in which a high-resistance load type or TFT load type SRAM is formed and logic circuits and the like are also formed in a non-memory cell region in addition to the peripheral circuits of the SRAM, and to a method of fabricating the ASIC.

In the semiconductor device according to the present invention as has been described above, even if α rays enter into a semiconductor base, changes in the amount of electric charge in a diffusion layer of a first field-effect transistor in a memory cell region can be suppressed. This increases the soft error resistance of the memory cell.

Additionally, the threshold voltage of a second field-effect transistor in a non-memory cell region is lower than the threshold voltage of the first field-effect transistor in the memory cell region, and an increase in the standby current in the memory cell region is prevented. This prevents a decrease in the operating speed and an increase in the consumption power.

Furthermore, a first buried diffusion layer in the memory cell region can be formed simultaneously with a second buried diffusion layer in the non-memory cell region. Consequently, it is possible to suppress an increase in the fabrication cost caused by an increase in the number of fabrication steps.

Also, when the first buried diffusion layer extends only by 0.5 to 2.0 $\mu$m from the memory cell region into the non-memory cell region, it is possible to suppress an increase in the necessary area while suppressing variations in the charge amount in the diffusion layer of the first field-effect transistor even in the peripheral portion of the memory cell region. Therefore, the soft error resistance can be increased while a decrease in the integration degree is suppressed.

When a first plug region exposed to the surface of the semiconductor base is connected to the first buried diffusion layer in the memory cell region, a positive voltage can be easily applied to this first buried diffusion layer. Therefore, the soft error resistance can be easily increased. In addition, since the first plug region can be formed simultaneously with a second plug region, an increase in the fabrication cost due to an increase in the number of fabrication steps can also be suppressed.

When the thickness of a semiconductor layer on the first and second buried diffusion layers is 0.5 to 1 $\mu$m, the soft error occurrence rate of the memory cell is low, and the open-base, grounded-emitter maximum collector voltage and the collector current of a bipolar transistor are large. This increases the soft error resistance of the memory cell and improves the characteristics of the bipolar transistor.

In a first method of fabricating a semiconductor device according to the present invention, no defective layers caused by ion implantation damage locally remain in a semiconductor base. Additionally, the number of fabrication steps is not increased by the formation of a first buried diffusion layer in a memory cell region. Consequently, a semiconductor device in which the soft error resistance of a memory cell is high and a decrease in the operating speed and an increase in the consumption power are prevented can be fabricated without lowering the storage retention ability on a one-bit level while an increase in the fabrication cost is suppressed.

A P-type impurity is simultaneously doped into the channel regions of both first and second field-effect transistors, and a P-type impurity is doped only into the channel region of the first field-effect transistor. When the threshold voltage of the first field-effect transistor is made higher than the threshold voltage of the second field-effect transistor in this way, the number of masks can be decreased. Consequently, an increase in the fabrication cost can be further suppressed.

In a second method of fabricating a semiconductor device according to the present invention, the base width of a bipolar transistor can be accurately controlled, and diffusion of an impurity in a load element can be prevented. Therefore, it is possible to fabricate a semiconductor device in which the characteristics of both the bipolar transistor and the load element are improved.

Also, when phosphorus is doped into a connecting portion between a storage node diffusion layer and a load element of a flip-flop, the junction leakage in this storage node diffusion layer can be reduced. Consequently, a semiconductor device in which the storage retention characteristics of a memory cell are improved can be fabricated.

Furthermore, when the temperature of rapid thermal annealing for forming at least the base and emitter regions of the bipolar transistor is set at 1000 to 1150° C., the base width of the bipolar transistor can be accurately controlled. In addition, it is possible to prevent deterioration of a gate insulating film of a field-effect transistor and prevent injection of hot carriers into the gate insulating film. Accordingly, it is possible to fabricate a semiconductor device in which the characteristics of all of the bipolar transistor, the load element and the field-effect transistor are improved.

What is claimed is:

1. A method of fabricating a semiconductor device in which a memory cell region having a first N-type field-effect transistor and a non-memory cell region having an NPN bipolar transistor and a second N-type field-effect transistor are formed in the same semiconductor base, comprising the steps of:

simultaneously forming first and second N-type diffusion layers in surface portions of a semiconductor substrate in said memory cell region and a region in which said bipolar transistor is to be formed, respectively;

growing an epitaxial layer on said semiconductor substrate to form said semiconductor base and convert said diffusion layers into buried diffusion layers; and making a threshold voltage of said first field-effect transistor higher than a threshold voltage of said second field-effect transistor.

2. A method according to claim 1, further comprising the steps of:

simultaneously doping a P-type impurity into channel regions of said first and second field-effect transistors; and doping a P-type impurity only into the channel region of said first field-effect transistor.

3. A method of fabricating a semiconductor device having a memory cell region in which a flip-flop including a field effect transistor and a load element is formed and a non-memory cell region in which a bipolar transistor is formed, comprising the steps of:

forming at least a base region and an emitter region of said bipolar transistor by rapid thermal annealing;

forming said load element after said rapid thermal annealing;

forming said load element connected to a storage node diffusion layer of said flip-flop; and doping phosphorus into said connecting portion;

and wherein a field-effect transistor having a conductivity type opposite to a conductivity type of said field-effect transistor is used as said load element, and a gate electrode of said field-effect transistor having the opposite type is connected to said storage node diffusion layer.

4. A method according to claim 3, wherein a temperature of said rapid thermal annealing is set at to 1150° C.

5. A method of fabricating a semiconductor device having a memory cell region in which a flip-flop including a field effect transistor and a load element is formed and a non-memory cell region in which a bipolar transistor is formed, comprising the steps of:

forming at least a base region and an emitter region of said bipolar transistor by rapid thermal annealing;

forming said load element after said rapid thermal annealing;

forming said load element directly connected to a storage node diffusion layer of said flip-flop; and doping phosphorus into said connecting portion.

6. A method according to claim 5, wherein a resistive element is used as said load element.

7. A method according to claim 5, wherein a field-effect transistor having a conductivity type opposite to a conductivity type of said field-effect transistor is used as said load element, and a gate electrode of said field-effect transistor having the opposite conductivity type is connected to said storage diffusion layer.

8. A method according to claim 5, wherein a temperature of said rapid thermal annealing is set at 1000 to 1150° C.

* * * * *